United States Patent [19]
Kaida

[11] Patent Number: 5,621,263
[45] Date of Patent: *Apr. 15, 1997

[54] PIEZOELECTRIC RESONANCE COMPONENT

[75] Inventor: Hiroaki Kaida, Nagaokakyo, Japan

[73] Assignee: Murata Manufacturing Co., Ltd., Japan

[*] Notice: The term of this patent shall not extend beyond the expiration date of Pat. No. 5,422,532.

[21] Appl. No.: 285,233

[22] Filed: Aug. 3, 1994

[30] Foreign Application Priority Data

Aug. 9, 1993 [JP] Japan .................................. 5-197270
Oct. 21, 1993 [JP] Japan .................................. 5-263769

[51] Int. Cl.$^6$ .................................................. H01L 41/08
[52] U.S. Cl. .......................................... 310/333; 310/326
[58] Field of Search .................................. 310/312, 340, 310/344, 348, 333, 326

[56] References Cited

U.S. PATENT DOCUMENTS

| | | | |
|---|---|---|---|
| 2,443,471 | 6/1948 | Mason | 310/326 |
| 3,185,943 | 5/1965 | Honda et al. | 310/326 |
| 3,411,023 | 11/1968 | Quate et al. | 310/312 |
| 3,488,530 | 1/1970 | Staudte | 310/361 |
| 3,723,920 | 3/1973 | Sheahan et al. | 333/72 |
| 3,745,385 | 7/1973 | Nakajima | 310/95 |
| 4,101,795 | 7/1978 | Fukomoto et al. | 310/336 |

(List continued on next page.)

FOREIGN PATENT DOCUMENTS

| | | | |
|---|---|---|---|
| 0496583 | 1/1928 | European Pat. Off. | H03H 9/19 |
| 0365268 | 4/1990 | European Pat. Off. | H03H 9/19 |
| 2547458 | 2/1984 | France | 310/346 |

(List continued on next page.)

OTHER PUBLICATIONS

Co-pending U.S. Patent Application No. 08/452,516.
Co-pending U.S. Patent Application No. 08/458,171.
Co-pending U.S. Patent Application No. 08/506,262.
Co-pending U.S. Patent Application No. 08/459,185.
J.P Den Hartog, "Mechanical Vibrations", pp. 87–83, Dover Publications, Inc. New York, 1985.
Osamu Taniguchi, "Vibration Engineering", pp. 113–116, Corona Publishing Co., Ltd. with English language translation.
Great Britain Search Report dated Nov. 10, 1994.
J. Ormondroyd & J.P. Hartog, "The Theory of the Dynamic Vibration Absorber", pp. 9–22, Transactions of the American Society of Mechanical Engineers, APM–50–7.
Co-pending U.S. Patent Application No. 08/287,530.
Co-pending U.S. Patent Application No. 08/443,783.
Co-pending U.S. Patent Application No. 08/444,831.
Co-pending U.S. Patent Application No. 08/292,244.
Co-pending U.S. Patent Application No. 08/426,689.
Co-pending U.S. Patent Application No. 08/423,466.
Co-pending U.S. Patent Application No. 08/524,052 U.S. PN. 5,548,180 issue date Aug. 20, 1996.
Inoue et al., "First and Second Order Group Timing Tank Ceramic Filters for PCM Carriers Systems," Japanese Journal of Applied Physics, vol. 20, 1981, Supplement 20–4, pp. 101–104.

Primary Examiner—Thomas M. Dougherty
Attorney, Agent, or Firm—Ostrolenk, Faber, Gerb & Soffen, LLP

[57] ABSTRACT

A piezoelectric resonance component includes spacer plates located on both side surfaces of a piezo-resonator so as to form through clearances for allowing vibration of a vibrating part. Case substrates are located on both major surfaces of the piezo-resonator and the spacer plates through spacer frame members for defining clearances for allowing vibration of the vibrating part of the piezo-resonator. Dynamic dampers are located between the vibrating part of the piezo-resonator and ends of a piezoelectric substrate for suppressing vibration received from the vibrating part and for preventing vibration from being transmitted to a holding part.

7 Claims, 12 Drawing Sheets

U.S. PATENT DOCUMENTS

| | | | |
|---|---|---|---|
| 4,104,553 | 8/1978 | Engdahl et al. | 310/352 |
| 4,287,493 | 9/1981 | Masaie | 333/191 |
| 4,323,865 | 4/1982 | Tanaka et al. | 333/187 |
| 4,348,609 | 9/1982 | Inoue | 310/367 |
| 4,350,918 | 9/1982 | Sato | 310/367 |
| 4,356,421 | 10/1982 | Shimizu et al. | 310/320 |
| 4,365,181 | 12/1982 | Yamamoto | 310/320 |
| 4,443,728 | 4/1984 | Kudo | 310/312 |
| 4,447,753 | 5/1984 | Ochiai | 310/312 |
| 4,454,444 | 6/1984 | Fujiwara et al. | 310/360 |
| 4,462,092 | 7/1984 | Kawabuchi et al. | 367/109 |
| 4,484,382 | 11/1984 | Kawashima et al. | 310/312 |
| 4,511,202 | 4/1985 | Kasai | 333/189 |
| 4,555,682 | 11/1985 | Gounji et al. | 333/189 |
| 4,562,372 | 12/1985 | Nakamura et al. | 310/321 |
| 4,564,825 | 1/1986 | Takahashi et al. | 333/191 |
| 4,571,794 | 2/1986 | Nakamura et al. | 29/25.35 |
| 4,609,844 | 9/1986 | Nakamura | 310/321 |
| 4,757,581 | 7/1988 | Yamada et al. | 29/25.35 |
| 4,900,971 | 2/1990 | Kawashima | 310/361 |
| 5,001,383 | 3/1991 | Kawashima et al. | 310/367 |
| 5,006,824 | 4/1991 | Paff | 333/197 |
| 5,059,853 | 10/1991 | Kawashima | 310/367 |
| 5,107,164 | 4/1992 | Kimura | 310/367 |
| 5,117,147 | 5/1992 | Yoshida | 310/320 |
| 5,118,980 | 6/1992 | Takahashi | 310/320 |
| 5,159,301 | 10/1992 | Kaida et al. | 333/187 |
| 5,192,925 | 3/1993 | Kaida | 333/187 |
| 5,202,652 | 4/1993 | Tabuchi et al. | 333/193 |
| 5,218,260 | 6/1993 | Kawashima | 310/361 |
| 5,260,675 | 11/1993 | Ogawa et al. | 333/189 |
| 5,274,297 | 12/1993 | Hermann | 310/361 |
| 5,302,880 | 4/1994 | Kaida | 310/346 |
| 5,341,550 | 8/1994 | Kaida | 310/321 |
| 5,394,123 | 2/1995 | Inoue et al. | 333/189 |
| 5,422,532 | 6/1995 | Inoue et al. | 310/326 |
| 5,442,251 | 8/1995 | Inoue et al. | 310/321 |
| 5,495,135 | 2/1996 | Zimnicki et al. | 310/312 |

FOREIGN PATENT DOCUMENTS

| | | | |
|---|---|---|---|
| 2939844 | 7/1980 | Germany | H03H 9/19 |
| 3220032 | 12/1982 | Germany | H03H 9/05 |
| 4321949 | 1/1994 | Germany | 310/32 |
| 55-52621 | 4/1980 | Japan | H03H 9/05 |
| 55-49013 | 4/1980 | Japan | H03H 9/10 |
| 55-64414 | 5/1980 | Japan | H03H 9/10 |
| 57-48818 | 3/1982 | Japan | H03H 9/10 |
| 57-91016 | 6/1982 | Japan | H03H 9/17 |
| 0137113 | 7/1985 | Japan | H03H 9/05 |
| 61-154211 | 7/1986 | Japan | H03H 9/17 |
| 63-260310 | 10/1988 | Japan | H03H 9/19 |
| 63-253711 | 10/1988 | Japan | H03H 9/58 |
| 63-260311 | 10/1988 | Japan | 310/367 |
| 63-311810 | 12/1988 | Japan | H03H 9/02 |
| 1180109 | 7/1989 | Japan | H03H 9/02 |
| 0279511 | 3/1990 | Japan | H03H 9/19 |
| 0279510 | 3/1990 | Japan | H03H 9/19 |
| 0275213 | 3/1990 | Japan | H03H 9/19 |
| 3226106 | 10/1991 | Japan | H03H 9/19 |
| 4192909 | 7/1992 | Japan | H03H 9/17 |
| 5-75372 | 3/1993 | Japan | H03H 9/05 |
| 16061775 | 3/1994 | Japan | 333/195 |
| 2004434 | 3/1979 | United Kingdom | H03H 9/26 |
| 2043995 | 10/1980 | United Kingdom | H03H 9/09 |
| 2102199 | 5/1982 | United Kingdom | H03H 9/05 |
| 2117968 | 10/1983 | United Kingdom | H03H 9/19 |
| 2213013 | 8/1989 | United Kingdom | H03H 9/10 |
| 2224159 | 4/1990 | United Kingdom | H03H 9/19 |
| 1358596 | 6/1990 | United Kingdom | H03H 9/14 |
| 2278721 | 12/1994 | United Kingdom | 310/340 |
| 9216997 | 10/1992 | WIPO | H03H 9/58 |

PIEZOELECTRIC RESONANCE COMPONENT

BACKGROUND OF THE INVENTION

1. Field of the Invention

The present invention relates to an energy trap type piezoelectric resonance component, and more particularly, it relates to a chip-type piezoelectric resonance component preferably utilizing a shear vibration mode of thickness shear vibration of width shear vibration, which can be surface-mounted on a printed circuit board or the like.

2. Description of the Background Art

FIG. 2 is a perspective view showing an exemplary piezo-resonator part of a conventional energy trap type piezoelectric resonance component utilizing a width shear vibration mode. A piezo-resonator 1 comprises an elongated rectangular piezoelectric substrate 2 and excitation electrodes 3 and 4 which are provided on both side surfaces thereof. The piezoelectric substrate 2 is polarized along arrow P. The excitation electrodes 3 and 4 are located to be opposed to each other through the piezoelectric substrate 2, so that vibration is excited by the opposed portions of the excitation electrodes 3 and 4. Further, the excitation electrodes 3 and 4 are arranged to reach different ends of the piezoelectric substrate 2, whereby the piezo-resonator 1 is electrically connected with the exterior and mechanically held on both ends of the piezoelectric substrate 2.

In order to form a chip-type piezoelectric resonance component for surface mounting by the aforementioned piezo-resonator 1, a pair of spacer plates are arranged on both side surfaces of the piezo-resonator 1 through clearances for allowing vibration of the piezoelectric substrate 2, while upper and lower portions thereof are held by a pair of case substrates through frame members etc. serving as spacers for allowing vibration, thereby preparing a chip-type laminate.

In the aforementioned energy trap type piezo-resonator 1, vibration as excited is trapped in a part between the opposed portions of the excitation electrodes 3 and 4, i.e., in a vibrating part, and this vibration is sufficiently damped in the vicinity of both ends of the piezoelectric substrate 2. Even if the piezoelectric substrate 2 is mechanically held on its both ends, therefore, resonance characteristics are hardly deteriorated.

A plurality of such piezo-resonators 1 are generally mass-produced by forming mother excitation electrodes on a mother piezoelectric substrate and thereafter cutting the mother substrate. In order to increase the number of piezo-resonators which can be manufactured from a single mother piezoelectric substrate thereby improving mass productivity, therefore, it is desirable to reduce the length L of each piezoelectric substrate 2. Further, miniaturization is required for piezo-resonators similarly to other electronic components, and it is desirable to reduce the length L of each piezoelectric substrate 2.

When the length L of the piezoelectric substrate 2 is reduced, however, vibration is insufficiently damped in the vicinity of both ends of the piezoelectric substrate 2. When the piezoelectric substrate 2 is mechanically held at both ends, thereof the resonance characteristics are disadvantageously deteriorated. Particularly in the piezo-resonator 1 shown in FIG. 2, the resonance characteristics are determined by the width of the piezoelectric substrate 2, while it is impossible to sufficiently damp vibration when the width of the piezoelectric substrate 2 is increased to implement a low frequency band, unless the length L thereof is also increased in response. In general, therefore, it has been extremely difficult to attain sufficient resonance characteristics while reducing the length L of the piezoelectric substrate 2.

SUMMARY OF THE INVENTION

In order to solve the aforementioned problems of the prior art, an object of at least one of the preferred embodiments of the present invention is to provide a surface-mountable energy trap type piezoelectric resonance component utilizing a shear vibration mode, which can further effectively trap energy of a shear vibration mode in a vibrating part and further reduce a length of a piezoelectric substrate.

The piezoelectric resonance component according to at least one of the preferred embodiments of the present invention comprises a piezo-resonator, a pair of spacer plates which are arranged through clearances for allowing vibration of a vibrating part of the piezo-resonator, and a pair of case substrates which are connected to a resonance plate formed by the piezo-resonator and the spacer plates. The aforementioned piezo-resonator employed in one of the preferred embodiments of the present invention has at least one piezoelectric vibrating part preferably utilizing a shear mode, a first coupling part which is coupled to the piezoelectric vibrating part, a dynamic damper which is coupled to the first coupling part, a second coupling part which is coupled to the dynamic damper, and a holding part which is coupled to the second coupling part. Namely, the piezoelectric resonance component according to one of the preferred embodiments of the present invention is formed by an energy trap type piezo-resonator utilizing a phenomenon of a dynamic damper.

The piezo-resonator, which is provided with at least one piezoelectric vibrating part, can be formed as a vibrator provided with a single piezoelectric vibrating part, or a filter provided with two or more piezoelectric vibrating parts.

The first coupling part, the dynamic damper, the second coupling part and the holding part, which are coupled to the aforementioned at least one piezoelectric vibrating part, may be coupled to only one side of a portion provided with the piezoelectric vibrating part, or each side of this portion. Preferably, the first coupling part, the dynamic damper, the second coupling part and the holding part are formed on each side of the portion provided with the piezoelectric vibrating part, so that it is possible to obtain a piezoelectric resonance component which is excellent in symmetry with a stable support structure for the piezoelectric vibrating part.

The piezo-resonator and the pair of spacer plates form a resonance plate in the finally obtained piezoelectric resonance component, so that the pair of spacer plates are fixed to both sides of the piezo-resonator to enclose the vibrating part of the piezo-resonator in the resonance plate. Thus, it is possible to obtain a piezoelectric resonance component having a sealed vibrating part.

Preferably, the piezo-resonator and the spacer plates are integrally formed by a single member. When such a single member is employed, the resonance plate is formed by a frame-type member having an opening receiving the vibrating part of the piezo-resonator. Since the vibrating part of the piezo-resonator is thus arranged in the opening so that side portions thereof are enclosed with a frame-type support part, it is possible to obtain a piezoelectric resonance component which is excellent in environment resistance.

The piezoelectric vibrating part of the piezo-resonator according to at least one of the preferred embodiments of the present invention can be made of piezoelectric ceramics such as lead zirconate titanate ceramics, or a piezoelectric substance such as a piezoelectric single crystal of $LiTaO_3$ or $LiNbO_3$. The piezoelectric vibrating part may alternatively be formed by providing a piezoelectric thin film on a metal plate or a semiconductor plate.

It is assumed that the piezoelectric vibrating part utilizing a shear mode includes any of the well-known various shear modes including a width shear mode.

Structures of electrodes which are provided on the piezoelectric vibrating part for exciting shear mode vibration are not particularly restricted but proper excitation electrodes are formed in order to strongly excite target vibration of a shear mode.

In a preferred specific mode of the present invention, a piezo-resonator provided with first coupling parts, dynamic dampers, second coupling parts and holding parts on both sides of at least one piezoelectric vibrating part comprises the following electrode structure: The piezo-resonator is provided with a plurality of excitation electrodes for exciting shear mode vibration. Further, the holding parts are provided with lead electrodes which are electrically connected with the holding parts. These lead electrodes are electrically connected to the excitation electrodes by connecting conductive parts which are formed to pass through the first coupling parts, the dynamic dampers and the second coupling parts. The piezoelectric resonance component is provided on its outer surface with terminal electrodes for connection with the exterior, and the terminal electrodes are electrically connected to the lead electrodes. Thus, it is possible to surface-mount the piezoelectric resonance component on a printed circuit board, for example, through the terminal electrodes provided on its outer surface, similarly to another chip-type electronic component. Namely, it is possible to arrange the inventive piezoelectric resonance component as a chip-type piezoelectric resonance component by forming the terminal electrodes on its outer surface as described above.

The feature of the piezoelectric resonance component according to one of the preferred embodiments of the present invention resides in that energy trap efficiency is improved through a phenomenon of a dynamic damper. Briefly stated, the phenomenon of a dynamic damper, which is described in "Vibration Engineering" by Osamu Taniguchi, Corona Publishing Co., Ltd., pp. 113 to 116 in detail, for example, is such a phenomenon that a principal vibrator which must be prevented from vibration is suppressed from vibration when a subvibrator is coupled to the same with proper selection of its natural frequency.

According to at least one of the preferred embodiments of the present invention, a dynamic damper utilizing such a phenomenon of a dynamic damper is provided between the piezoelectric vibrating part and the holding part. This dynamic damper is adapted to suppress vibration leaking from the first coupling part provided between the piezoelectric vibrating part and the dynamic damper through the phenomenon of a dynamic damper.

Since the dynamic damper is provided between the piezoelectric vibrating part and the holding part as described above, vibration leaking from the piezoelectric vibrating part is suppressed by the dynamic damper, whereby it is possible to effectively prevent the vibration from being transmitted to the holding part.

As hereinabove described, transmission of vibration to the holding part is effectively suppressed by the phenomenon of a dynamic damper in the piezo-resonator utilizing a shear mode which is employed in the inventive piezoelectric resonance component. In other words, the piezo-resonator employed in the present invention is the so-called energy trap type piezo-resonator trapping vibrational energy in a portion up to the dynamic damper.

According to at least one of the preferred embodiments of the present invention, vibrational energy is effectively trapped in the portion up to the dynamic damper, whereby it is possible to provide a miniature piezoelectric resonance component utilizing a shear mode without causing deterioration of resonance characteristics.

According to at least one of the preferred embodiments of the present invention, the dynamic damper is provided between the piezoelectric vibrating part and the holding part, and the distance between the piezoelectric vibrating part and the holding part can be reduced with no deterioration of resonance characteristics by a vibration suppressing effect by the dynamic damper. Therefore, it is possible to reduce the distance between the piezoelectric vibrating part and the holding part as compared with that between a vibrating part and an end of a piezoelectric substrate in a conventional piezo-resonator utilizing a shear mode, as well as to implement excellent resonance characteristics.

According to at least one of the preferred embodiments of the present invention, therefore, the piezoelectric resonance component is formed by a miniature piezo-resonator utilizing a shear mode hardly causing deterioration of resonance characteristics. This piezoelectric resonance component is formed by stacking case substrates on upper and lower portions of a resonance plate which is defined by the piezo-resonator and the pair of spacer plates while the vibrating part is formed in the piezoelectric resonance component, whereby it is possible to provide a piezoelectric resonance component utilizing a shear mode, which is excellent in resonance characteristics.

The foregoing and other objects, features, aspects and advantages of the preferred embodiments of present invention will become more apparent from the following detailed description of the preferrred embodiments of the present invention when taken in conjunction with the accompanying drawings.

DESCRIPTION OF THE PREFERRED EMBODIMENTS

Embodiments of the present invention are now described to clarify the present invention.

Figure 3:
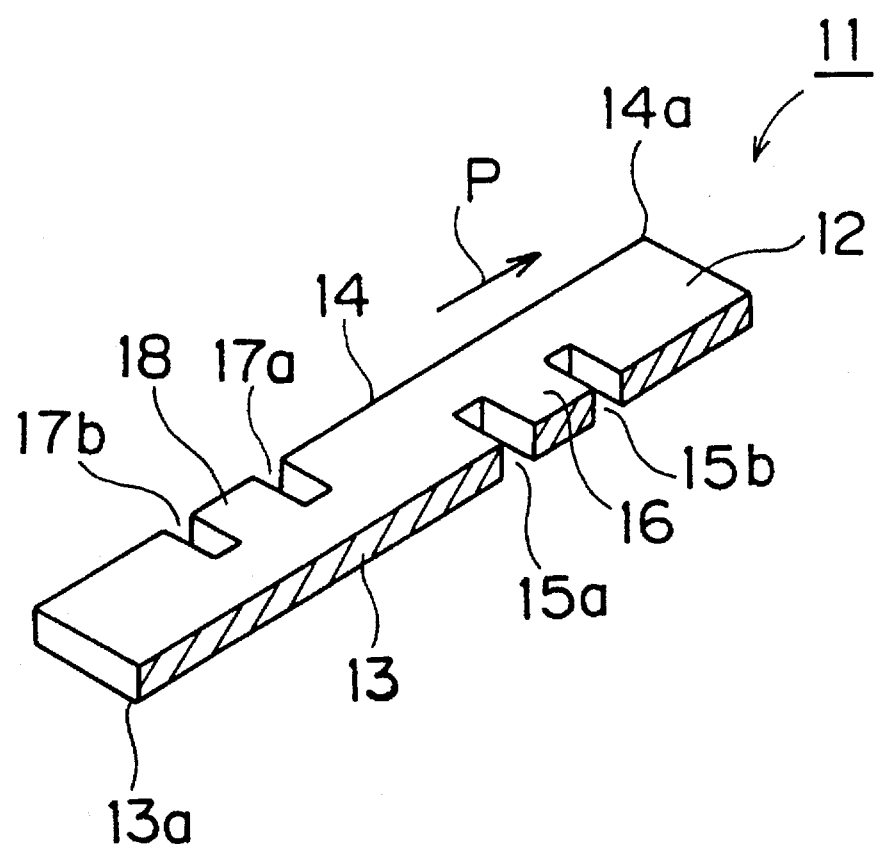
FIG. 3 is a perspective view showing an energy trap type piezo-resonator which is employed in the first preferred embodiment of the present invention.

FIG. 3 is a perspective view showing an energy trap type piezo-resonator 11 utilizing width shear vibration according to a first preferred embodiment of the present invention.

The piezo-resonator 11 is formed by a piezoelectric substrate 12 having an elongated rectangular planar shape. This piezoelectric substrate 12 is made of a piezoelectric material such as piezoelectric ceramics, for example, and polarized along arrow P, i.e., along its longitudinal direction.

An excitation electrode 13 is formed on a first side surface of the piezoelectric substrate 12. After the excitation electrode 13 is formed on the first side surface, grooves 15a and 15b are formed to cross-directionally extend from the first side surface toward a second side surface, thereby defining a dynamic damper 16 therebetween. Another excitation electrode 14 is formed on the second side surface of the piezoelectric substrate 12, and grooves 17a and 17b are formed after formation of this excitation electrode 14 to define another dynamic damper 18 therebetween.

The excitation electrodes 13 and 14 are arranged to be opposed to each other in a longitudinal central region of the piezoelectric substrate 12. An alternating voltage is applied across the excitation electrodes 13 and 14, thereby exciting width shear vibration in the piezoelectric substrate portion opposing the excitation electrodes 13 and 14 to each other. Thus, the portion opposing the excitation electrodes 13 and 14 to each other defines a piezoelectric vibrating part. The excitation electrodes 13 and 14 are electrically connected with terminal electrodes as described below, at end portions 13a and 14a thereof, respectively. Thus, a portion of the excitation electrode 13 outward beyond the grooves 15a and 15b does not serve as an electrode, while a portion of the excitation electrode 14 outward beyond the grooves 17a and 17b does not serve as an electrode either.

In the piezo-resonator 11 according to this preferred embodiment, the grooves 15a, 15b, 17a and 17b are provided to define the dynamic dampers 16 and 18 therebetween, respectively. Further, piezoelectric substrate portions located on sides of the grooves 15a and 17a define first coupling parts, those located on sides of the grooves 15b and 17b define second coupling parts, and those located on outer sides of the grooves 15b and 17b define holding parts. The dynamic dampers 16 and 18 receive vibration leaking from the vibrating part and vibrate, to suppress the vibration by a phenomenon of a dynamic damper. Therefore, preferably the shapes of the dynamic dampers 16 and 18 are determined so that natural frequencies thereof are equal to the frequency of the vibration propagated from the vibrating part.

In the piezo-resonator 11 according to this preferred embodiment, vibration which is not trapped in the piezoelectric vibrating part, i.e., that leaking from the vibrating part toward both ends of the piezoelectric substrate 12 is sufficiently damped by the dynamic dampers 16 and 18. Thus, vibrational energy is reliably trapped between the regions provided with the dynamic dampers 16 and 18. Therefore, the vibration is hardly transmitted to piezoelectric substrate portions outward beyond the dynamic dampers 16 and 18 even if the piezoelectric substrate 12 is reduced in length, whereby it is possible to mechanically hold portions of the piezoelectric substrate 12 which are close to longitudinal ends thereof.

Figure 1:
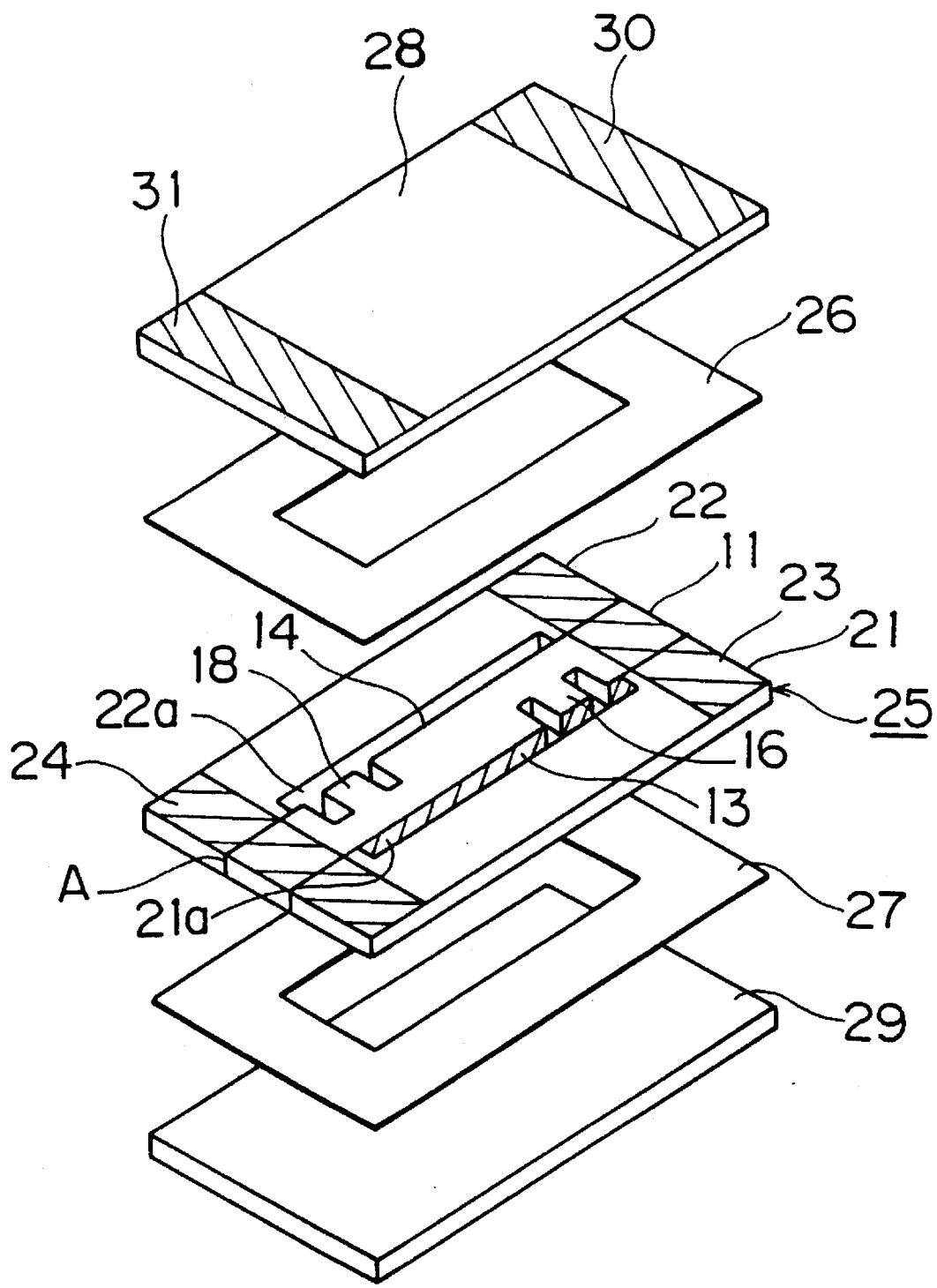
FIG. 1 is a perspective view showing a piezoelectric resonance component according to a first preferred embodiment of the present invention.
Figure 2:
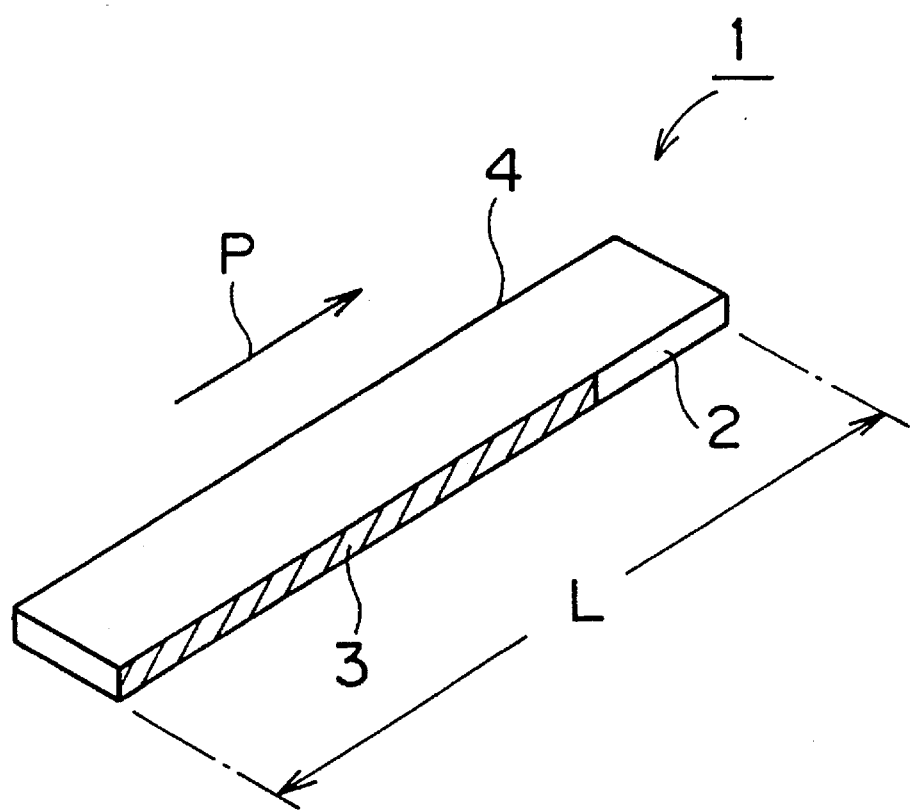
FIG. 2 is a perspective view showing a conventional energy trap type piezo-resonator.

FIG. 1 is a perspective view showing a combined state of a chip-type piezoelectric resonance component in which the piezo-resonator 11 shown in FIG. 3 is integrated. As shown in FIG. 1, a pair of spacer plates 21 and 22 are arranged on both sides of the piezo-resonator 11. These spacer plates 21 and 22 are provided with cavities 21a and 22a, respectively, to allow vibration of the vibrating part of the piezo-resonator 11. These spacer plates 21 and 22 are so combined that ends thereof are in contact with both side surfaces of the piezo-resonator 11, to define a resonance plate 25. Terminal electrodes 23 and 24 are formed on both end portions of an upper surface of the resonance plate 25. Due to the grooves 15a, 15b, 17a and 17b provided in the piezo-resonator 11 as described above, the terminal electrodes 23 are electrically connected with only the excitation electrode 14, while the terminal electrodes 24 are electrically connected with only the excitation electrode 13.

Case substrates 28 and 29 are pasted to/stacked on upper and lower portions of the resonance plate 25 through spacer frame members 26 and 27 respectively, to hold the resonance plate therebetween. The spacer frame members 26 and 27 are interposed to define clearances, so that the case substrates 28 and 29 are not in contact with the vibrating part of the piezo-resonator 11 so as to not inhibit the vibrating part from vibration. Such spacer frame members 26 and 27 may be replaced by adhesive layers which are formed in sufficient thicknesses to serve as spacers. Alternatively, cavities may be formed in inner side portions of the case substrates 28 and 29 to define clearances for allowing vibration of the vibrating part of the piezo-resonator 11.

External connection electrodes 30 and 31 are formed on both ends of an upper surface of the case substrate 28.

Figure 4:
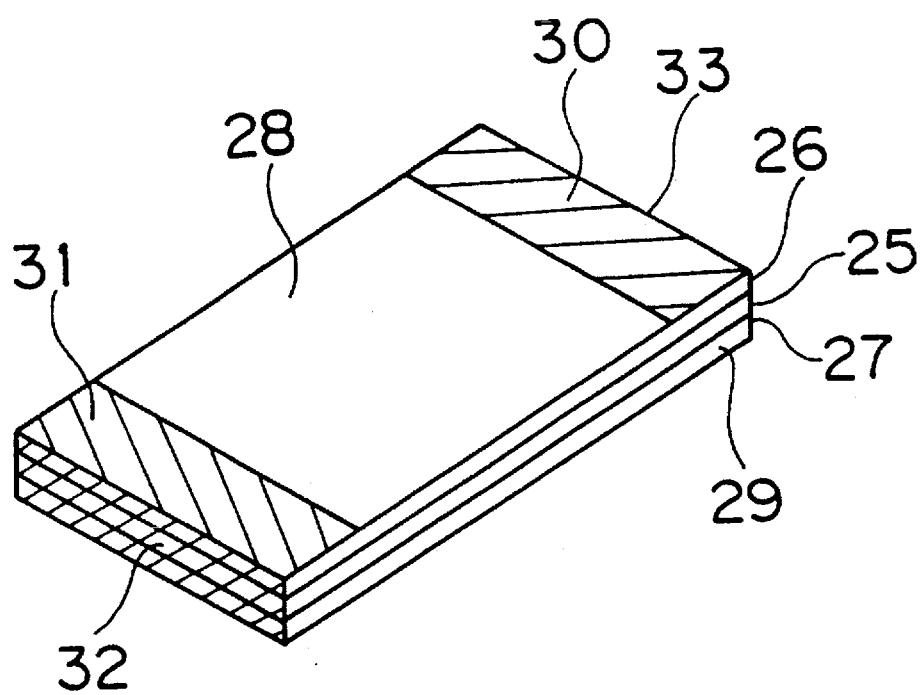
FIG. 4 is a perspective view showing the piezo-resonator, spacer plates and case substrates which are pasted and stacked with each other

FIG. 4 is a perspective view showing a laminate, which is obtained by pasting and stacking the case substrates 28 and 29 to and on the upper and lower portions of the resonance plate 25 through the spacer frame members 26 and 27 in the combined state shown in FIG. 1. As shown in FIG. 4, end electrodes 32 and 33 are formed on both end surfaces of the laminate. The end electrodes 32 and 33 are electrically connected with the external connection electrodes 31 and 30 provided on the case substrate 28, respectively. The end electrodes 32 and 33 are further electrically connected with the terminal electrodes 24 and 23 shown in FIG. 1, respectively.

Figure 5:
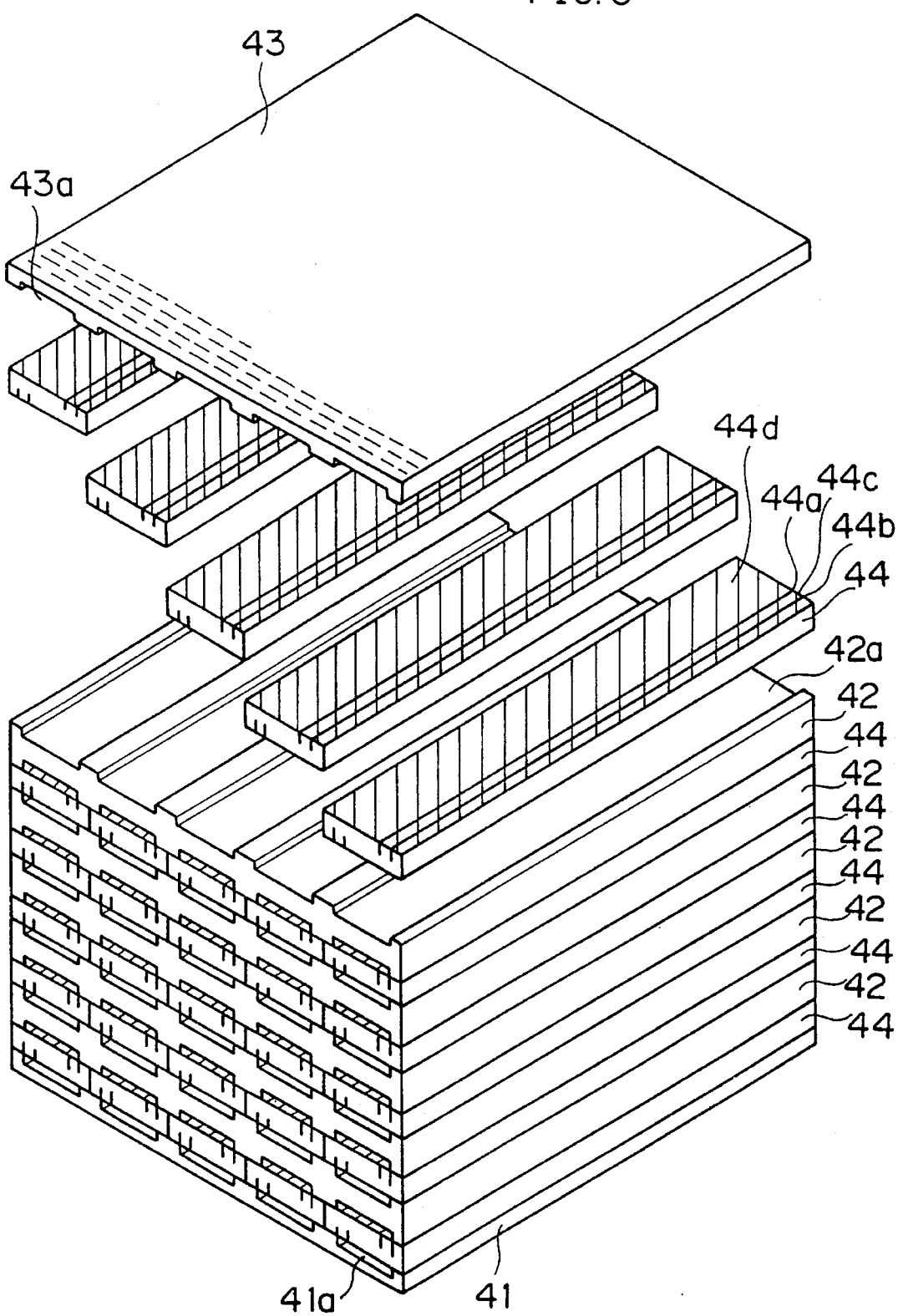
FIG. 5 is a perspective view for illustrating a step of manufacturing the piezoelectric resonance component according to the first preferred embodiment of the present invention.

FIG. 5 is a perspective view showing an exemplary manufacturing step for mass-producing the resonance plates 25 shown in FIG. 1. A mother spacer plate 41 provided with a plurality of trains of cavities 41a on its upper surface, mother spacer plates 42 each provided with plural trains of cavities 42a on its upper and lower surfaces, and a mother spacer plate 43 provided with a plurality of trains of cavities 43a on its lower surface are prepared so that the mother spacer plate 41 is arranged first and a mother piezo-resonator 44 is arranged thereon along the trains of cavities 41a. Then the first one of the mother spacer plates 42 is placed thereon so that additional mother piezo-resonators 44 and the remaining mother spacer plates 42 are alternately placed on the same and the mother spacer plate 43 is finally placed on the uppermost one of the mother piezo-resonators 44, thereby forming a mother laminate. This mother laminate is sliced along dotted lines appearing on an upper surface of the mother spacer plate 43, thereby obtaining mother resonance plates each provided with a plurality of resonance plates along longitudinal and transverse directions. Mother spacer frame members and mother case substrates are stacked on each mother resonance plate to attain the arrangement shown in FIG. 1, whereby a mother laminate for piezoelectric resonance components can be obtained. It is possible to form each piezoelectric resonance component by firing the mother laminate., thereafter cutting the same into each unit forming the piezoelectric resonance component, and forming end electrodes etc.

Figure 6:
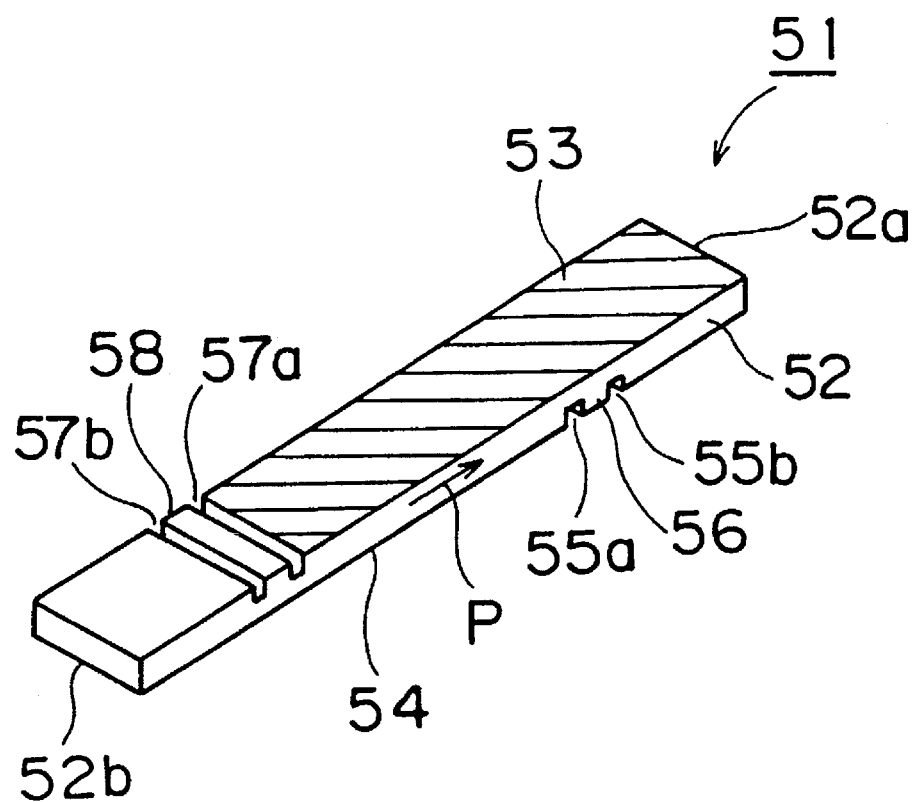
FIG. 6 is a perspective view showing a piezo-resonator which is employed in a piezoelectric resonance component according to a second preferred embodiment of the present invention.

FIG. 6 is a perspective view showing a piezo-resonator 51 utilizing a thickness shear vibration mode, which is provided in a piezoelectric resonance component according to a second preferred embodiment of the present invention. The piezo-resonator 51 is preferably formed by a piezoelectric substrate 52 having an elongated rectangular planar shape. This piezoelectric substrate 52 is made of a piezoelectric material such as piezoelectric ceramics, for example, and polarized along arrow P, i.e., along its longitudinal direction.

An excitation electrode 53 is formed on an upper surface of the piezoelectric substrate 52 to extend from a first end surface 52a to a central region. On the other hand, another excitation electrode 54 is formed on a lower surface of the piezoelectric substrate 52, to extend from a second end surface 52b to a central region. The excitation electrodes 53 and 54 are opposed to each other through the piezoelectric substrate 52 in the longitudinal central region thereof. When an alternating voltage is applied across the excitation electrodes 53 and 54, therefore, thickness shear vibration is excited in the piezoelectric substrate portion opposing the excitation electrodes 53 and 54 to each other. Thus, the piezoelectric substrate portion opposing the excitation electrodes 53 and 54 to each other defines a piezoelectric vibrating part.

Cross-directionally extending grooves 57a and 57b are formed on the upper surface of the piezoelectric substrate 52 between the vibrating part and the end surface 52b. Similarly, cross-directionally extending grooves 55a and 55b are also formed on the lower surface of the piezoelectric substrate 52 between the vibrating part and the end surface 52a.

In the piezo-resonator 51 according to this preferred embodiment, a dynamic damper 58 is defined by the grooves 57a and 57b, while another dynamic damper 56 is defined by the grooves 55a and 55b. Further, piezoelectric substrate portions above or under the grooves 55a and 57a form first coupling parts, those above or under the grooves 55b and 57b form second coupling parts, and those outward beyond the grooves 55b and 57b form holding parts. In the piezo-resonator 51 according to this preferred embodiment, therefore, vibration leaking from the vibrating part toward the end surfaces 52a and 52b of the piezoelectric substrate 52 is sufficiently damped by the dynamic dampers 56 and 58. Thus, it is possible to mechanically hold the piezoelectric substrates 52 in portions which are close to longitudinal ends without deteriorating its resonance characteristics.

Figure 7:
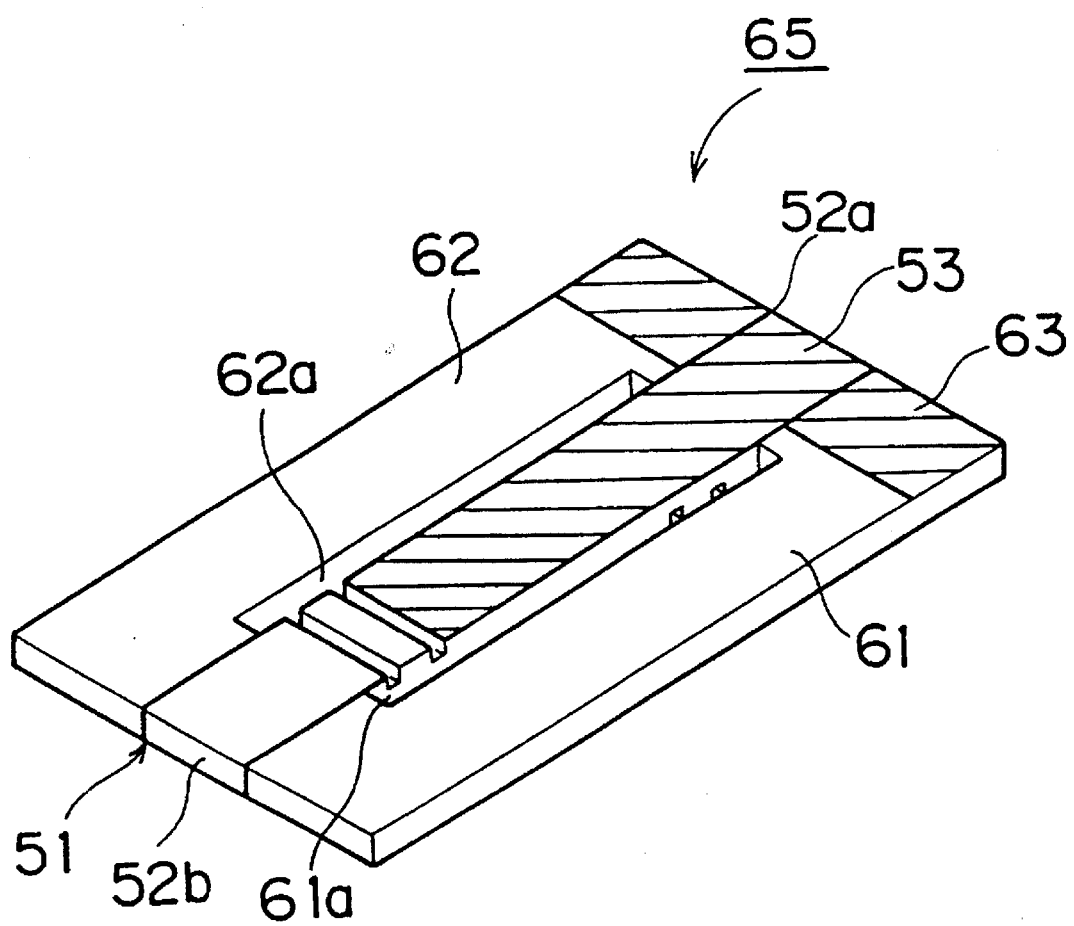
FIG. 7 is a perspective view showing a resonance plate which is formed by combining the piezo-resonator shown in FIG. 6 with spacer plates.

FIG. 7 is a perspective view showing a resonance plate which is formed by arranging spacer plates 61 and 62 on both sides of the piezo-resonator 51 shown in FIG. 6, respectively. The spacer plates 61 and 62 are provided with cavities 61a and 62a for defining clearances for allowing vibration of the piezo-resonator 51. Terminal electrodes 63 are formed on upper surfaces of the spacer plates 61 and 62 in portions which are close to the first end surface 52a of the piezo-resonator 51, and these terminal electrodes 63 are electrically connected with the excitation electrode 53 of the piezo-resonator 51. Also on lower surfaces (not shown) of the spacer plates 61 and 62, terminal electrodes are formed in portions which are close to the second end surface 52b of the piezo-resonator 53, to be electrically connected with the excitation electrode 54 (see FIG. 6) which is formed on the lower surface of the piezo-resonator 51.

It is possible to form a chip-type piezoelectric resonance component by pasting case substrates to upper and lower portions of the resonance plate shown in FIG. 7, similarly to the preferred embodiment shown in FIG. 1.

Figure 8:
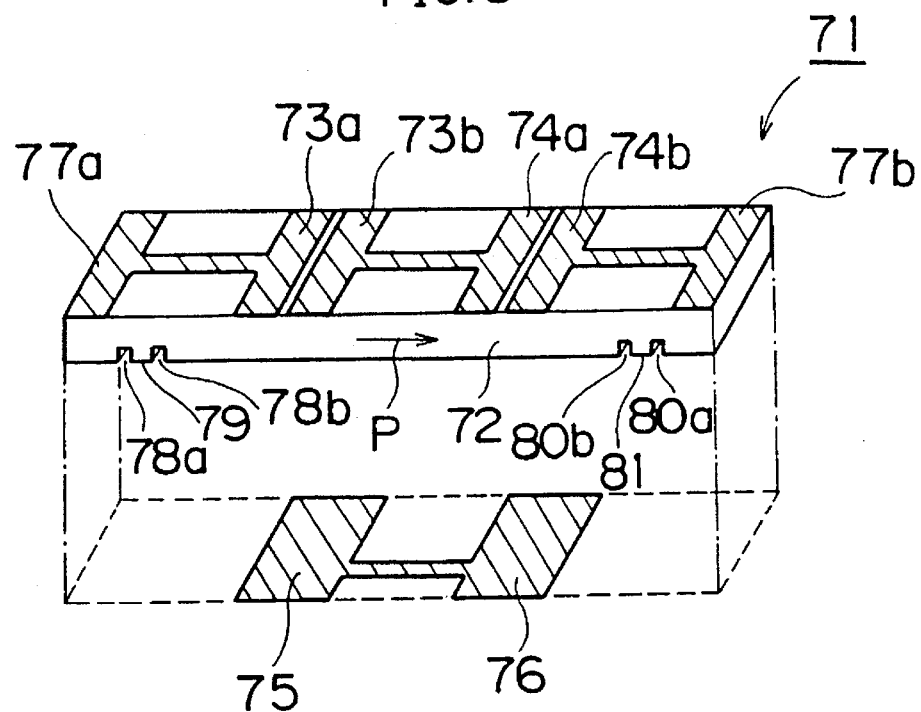
FIG. 8 is a perspective view showing a piezo-resonator which is employed in a piezoelectric resonance component according to a third preferred embodiment of the present invention.

FIG. 8 is a perspective view showing a piezo-resonator provided in a piezoelectric resonance component according to a third preferred embodiment of the present invention, which is applied to a double mode piezoelectric filter 71 utilizing a thickness shear vibration mode. This energy trap type double mode piezoelectric filter 71 is formed by an elongated rectangular piezoelectric substrate 72. The piezoelectric substrate 72 is made of a piezoelectric material such as piezoelectric ceramics, for example, and polarized along arrow P. Excitation electrodes 73a and 73b are formed on an upper surface of the piezoelectric substrate 72, to be opposed to each other through a slit of a prescribed width. Similarly, excitation electrodes 74a and 74b are formed on the upper surface of the piezoelectric substrate 72 in portions separated from the excitation electrodes 73a and 73b, to be opposed to each other through a slit of a prescribed width.

As shown in FIG. 8 in a projected manner, excitation electrodes 75 and 76 are further provided on a lower surface of the piezoelectric substrate 72, to be opposed to the excitation electrodes 73a, 73b, 74a and 74b, respectively.

On the upper surface of the piezoelectric substrate 72, a terminal electrode 77a provided on an end portion is electrically connected with the excitation electrode 73a by a connecting conductive part, while the excitation electrode 74b is electrically connected with another terminal electrode 77b by another connecting conductive part. Further, the excitation electrodes 73b and 74a are electrically connected with each other by a connecting conductive part, while the excitation electrodes 75 and 76 are similarly electrically connected with each other by a connecting conductive part on the lower surface of the piezoelectric substrate 72.

According to this preferred embodiment, a first resonance part is defined in a portion provided with the excitation electrodes 73a, 73b and 75, while a second resonance part is defined in a portion provided with the excitation electrodes 74a, 74b and 76. Further, an input/output end is defined across the terminal electrodes 77a and 77b and the excitation electrodes 75 and 76 are connected to a reference potential, thereby forming a three-terminal double mode piezoelectric filter.

According to this preferred embodiment, cross-directionally extending grooves 78a, 78b, 80a and 80b are formed in the lower surface of the piezoelectric substrate 72, thereby defining dynamic dampers 79 and 81 between the first and second resonance parts and ends of the piezoelectric substrate 72, respectively. Further, piezoelectric substrate portions above the grooves 78b and 80b define first coupling parts and those above the grooves 78a and 80a define second coupling parts, while those outward beyond the grooves 78a and 80a define holding parts.

Sizes of the dynamic dampers 79 and 81 are determined so as to sufficiently damp vibration propagated from the resonance parts. Also in this preferred embodiment, therefore, it is possible to substantially reliably prevent the vibration from leakage to the end portions of the piezoelectric substrate 72, due to actions of the dynamic dampers 79 and 81. Also in the piezo-resonator shown in FIG. 8, it is possible to form a chip-type piezoelectric resonance component by providing spacer plates on both sides to define a resonance plate and pasting case substrates to upper and lower portions thereof.

Figure 9:
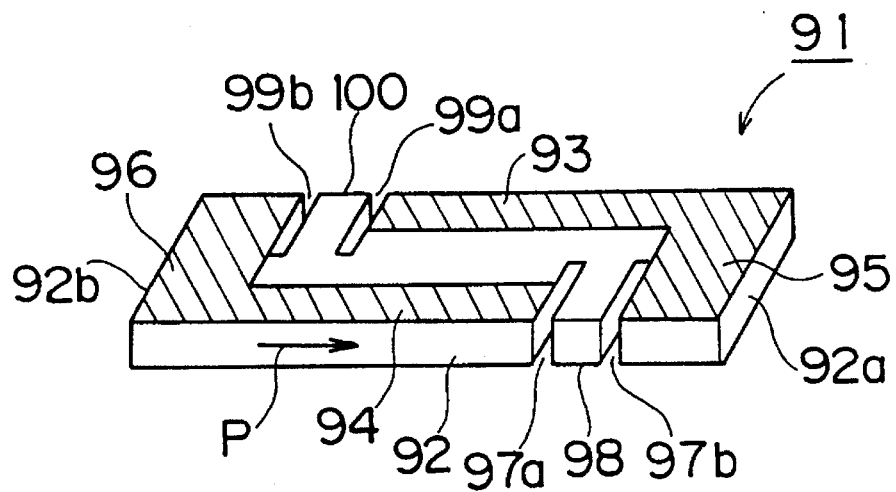
FIG. 9 is a perspective view showing a piezo-resonator which is employed in a piezoelectric resonance component according to a fourth preferred embodiment of the present invention.

FIG. 9 is a perspective view showing a piezo-resonator 91 which is employed in a piezoelectric resonance component according to a fourth preferred embodiment of the present invention. The piezo-resonator 91 is an energy trap type piezo-resonator utilizing a width shear vibration mode. An elongated rectangular piezoelectric substrate 92 is polarized along arrow P. Excitation electrodes 93 and 94 are provided on an upper surface of the piezoelectric substrate 92, to extend from end surfaces 92a and 92b along side edges of the piezoelectric substrate 92, respectively. The excitation electrodes 93 and 94 are opposed to each other on a central region of the upper surface of the piezoelectric substrate 92, and terminal electrodes 95 and 96 having relatively wide areas are formed on portions of the excitation electrodes 93 and 94 reaching the end surfaces 92a and 92b.

Grooves 97a, 97b, 99a and 99b are formed inwardly from side surfaces of the piezoelectric substrate 92 as shown in FIG. 9, thereby defining dynamic dampers 98 and 100. The dynamic dampers 98 and 100 are adapted to suppress vibration transmitted from a vibrating part toward the end portions of the piezoelectric substrate 92 by a phenomenon of a dynamic damper, and formed so as to have proper dimensions for suppressing the vibration.

Also in the piezo-resonator 91 shown in FIG. 9, it is possible to form a chip-type piezoelectric resonance component by providing spacer plates on both sides to define a resonance plate, and pasting case substrates to upper and lower portions thereof, similarly to the preferred embodiment shown in FIG. 1. Also in such a piezoelectric resonance component, transmission of vibration to the end portions of the piezoelectric substrate 92 is prevented due to actions of the dynamic dampers 98 and 100, whereby the piezoelectric substrate 92 can be reduced in length with no deterioration of resonance characteristics, for miniaturizing the chip-type piezoelectric resonance component.

Figure 10:
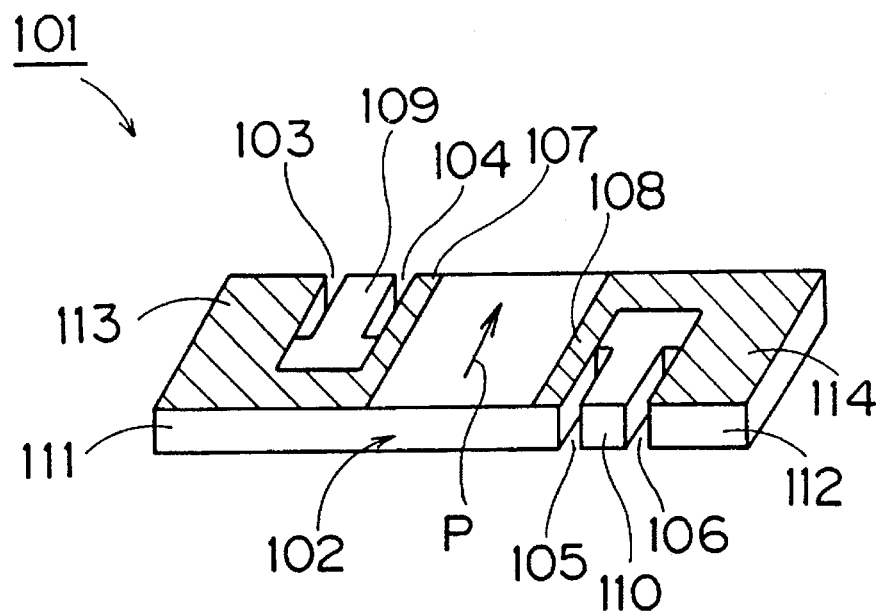
FIG. 10 is a perspective view showing a piezo-resonator which is employed in a piezoelectric resonance component according to a fifth preferred embodiment of the present invention.

FIG. 10 is a perspective view showing a piezo-resonator 101 which is employed for a piezoelectric resonance component according to a fifth preferred embodiment of the present invention. This piezo-resonator 101 is an energy trap type piezo-resonator utilizing a shear mode. An elongated rectangular piezoelectric substrate 102 is polarized along arrow P, i.e., in a cross direction perpendicular to its longitudinal direction. Grooves 103, 104, 105 and 106 are formed on side surfaces of the piezoelectric substrate 102, respectively. A piezoelectric vibrating part utilizing a shear mode is defined in a piezoelectric substrate portion which is held between the grooves 104 and 105. Excitation electrodes 107 and 108 are formed on an upper surface of the piezoelectric substrate 102 in the piezoelectric substrate portion between the grooves 104 and 105. The excitation electrodes 107 and 108 are formed to cross-directionally extend as shown in FIG. 10. When an alternating voltage is applied across the excitation electrodes 107 and 108, therefore, the piezoelectric vibrating part vibrates in a shear mode.

On the other hand, dynamic dampers 109 and 110 are formed in portions outward beyond the grooves 104 and 105, respectively. Further, holding parts 111 and 112 are formed in portions outward beyond the grooves 103 and 106, respectively.

According to this preferred embodiment, the grooves 103 to 106 are formed in the piezoelectric substrate 92 having a substantially rectangular planar shape, thereby defining the dynamic dampers 109 and 110 and the holding parts 111 and 112 on both sides of the piezoelectric vibrating part. First coupling parts according to the preferred embodiments of the present invention are piezoelectric substrate portions having small widths provided with the grooves 104 and 105, while second coupling parts are piezoelectric substrate portions having small widths provided with the grooves 103 and 106.

Lead electrodes 113 and 114 are formed on the holding parts 111 and 112, to be electrically connected with the excitation electrodes 107 and 108, respectively.

Also in this preferred embodiment, the dynamic dampers 109 and 110 are adapted to suppress vibration leaking from the piezoelectric vibrating part toward end portions of the piezoelectric substrate 102 by a phenomenon of a dynamic damper.

It is possible to obtain a piezoelectric resonance component according to the fifth preferred embodiment, by employing the piezo-resonator 101 of the fifth preferred embodiment in place of that according to the first preferred embodiment. Also in the piezoelectric resonance component obtained according to the fifth preferred embodiment, vibrational energy is trapped in portions up to the dynamic dampers 109 and 110 due to actions thereof, whereby the piezoelectric substrate 102 can be reduced in length with no deterioration of resonance characteristics. Thus, it is possible to miniaturize the chip-type piezoelectric resonance component.

As clearly understood from the above description of the second to fifth preferred embodiments, it is possible to employ various piezo-resonators having dynamic dampers utilizing shear modes in place of the piezo-resonator of the first preferred embodiment according to the present invention. Further examples of such energy trap type piezo-resonators having dynamic dampers are now described with reference to FIGS. 11 to 13.

Figure 11:
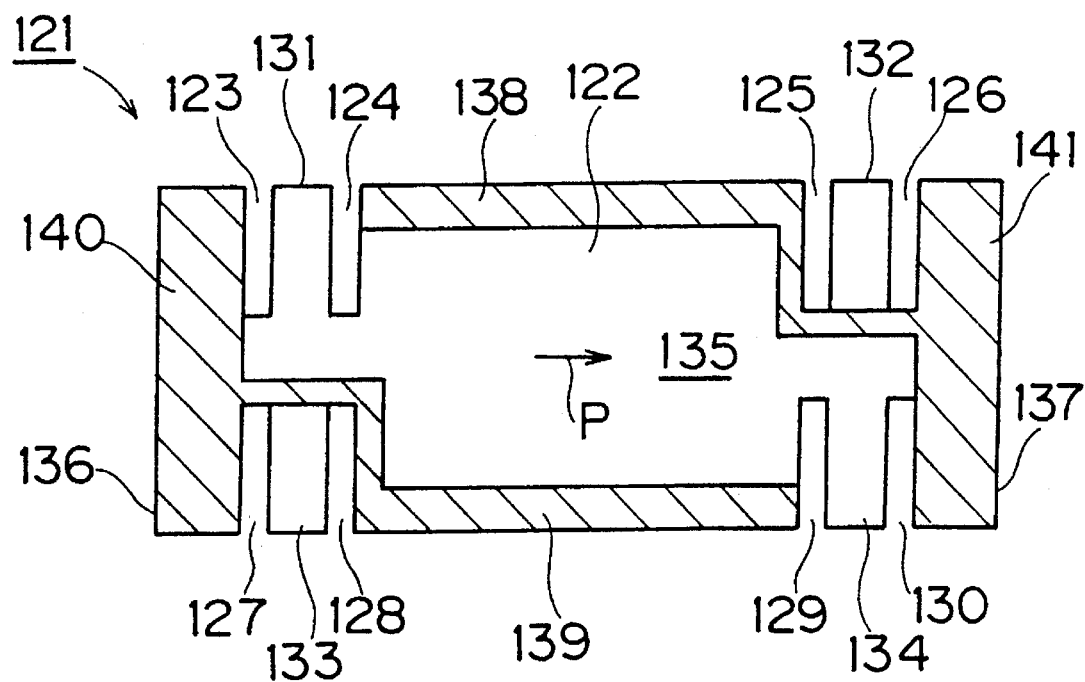
FIG. 11 is a plan view showing a piezo-resonator which is employed in a piezoelectric resonance component according to a sixth preferred embodiment of the present invention.

A piezo-resonator 121 shown in FIG. 11 is formed by an elongated rectangular piezoelectric substrate 122. In the piezoelectric substrate 122, grooves 123 to 126 and 127 to 130 are formed on both side surfaces, respectively, thereby defining dynamic dampers 131 to 134. Further, a piezoelectric substrate portion located between the grooves 124 and 125 defines a piezoelectric vibrating part 135 according to the preferred embodiments of the present invention. Further, holding parts 136 and 137 are formed in portions outward beyond the grooves 123 and 126, respectively. First coupling parts according to the preferred embodiments of the present invention are piezoelectric substrate portions which are held between the grooves 124 and 128 and between the grooves 125 and 129, respectively, while second coupling parts are a piezoelectric substrate portion which is located between the grooves 123 and 127 and a thin piezoelectric substrate portion which is located between the grooves 126 and 130.

In the piezoelectric vibrating part 135, the piezoelectric substrate 122 is polarized along arrow P in FIG. 11, i.e., along its longitudinal direction. On the other hand, excitation electrodes 138 and 139 are formed on an upper surface of the piezoelectric substrate 122 in parallel with the polarization direction P. Namely, the excitation electrodes 138 and 139 are formed on the upper surface of the piezoelectric substrate 122 in the piezoelectric vibrating part 135.

When an alternating voltage is applied across the excitation electrodes 138 and 139, therefore, the piezoelectric vibrating part 135 is excited in a shear mode. On the other hand, the dynamic dampers 131 to 134 are formed so as to suppress vibration leaking from the piezoelectric vibrating part 135 through the first coupling parts by a phenomenon of a dynamic damper. Also in the piezo-resonator 121, therefore, vibrational energy is trapped in portions up to those provided with the dynamic dampers 131 to 134.

The holding parts 136 and 137 are provided thereon with lead electrodes 140 and 141.

In the piezo-resonator 121 shown in FIG. 11, the plurality of grooves 123 to 130 are formed from both side surfaces of the piezoelectric substrate 122 toward its cross-directional center to be opposed to each other as described above, whereby the dynamic dampers 131, 133, 132 and 134 are formed on both sides of portions receiving leaking vibration.

Figure 12:
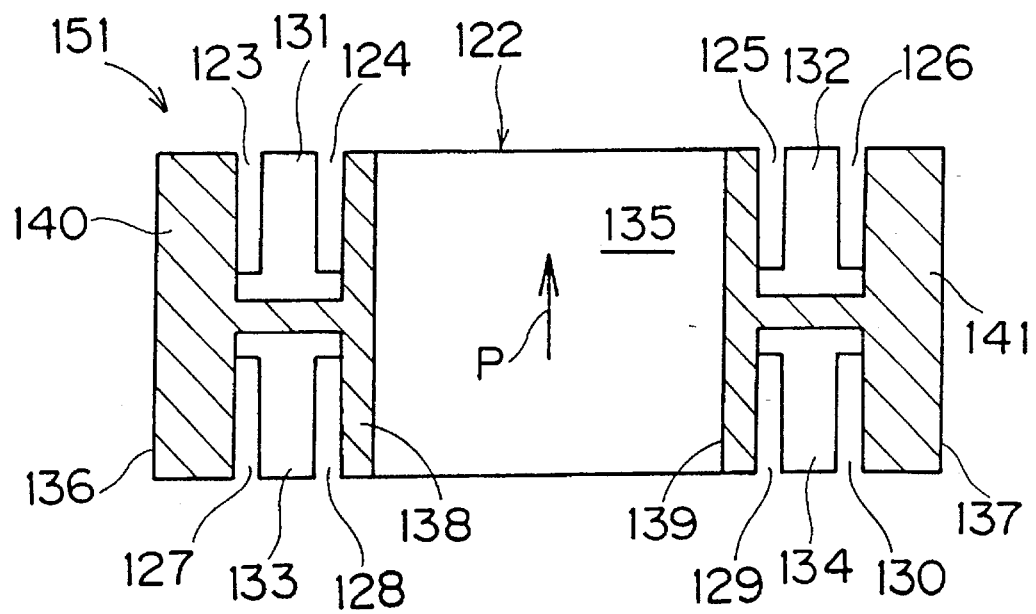
FIG. 12 is a plan view showing a modification of the piezo-resonator of the preferred embodiments of the present invention.

FIG. 12 shows a piezo-resonator 151 according to a preferred modification of the piezo-resonator 121 shown in FIG. 11. This piezo-resonator 151 is different from the piezo-resonator 121 in that a piezoelectric vibrating part 135 is polarized along arrow P in FIG. 12, i.e., cross-directionally in parallel with a piezoelectric substrate 122, and that excitation electrodes 138 and 139 are formed to extend along the cross direction. Other structures are substantially similar to those of the piezo-resonator 121, and hence identical portions are denoted by the same reference numerals, to omit redundant description.

Figure 13:
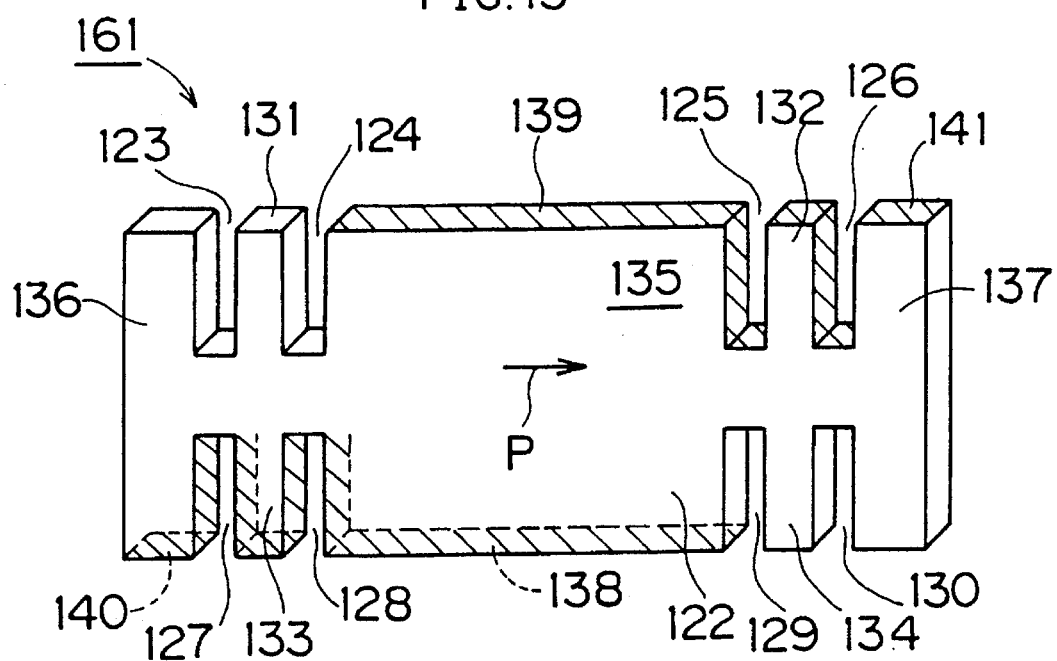
FIG. 13 is a perspective view showing another modification of the piezo-resonator of the preferred embodiments of the present invention.

FIG. 13 is a perspective view showing a piezo-resonator 161 according to another preferred modification of the piezo-resonator 121 shown in FIG. 11. In this piezo-resonator 161, a piezoelectric vibrating part 135 is polarized along arrow P in FIG. 13, i.e., longitudinally in parallel with a piezoelectric substrate 122. The piezo-resonator 161 is different from the piezo-resonator 121 in positions provided with electrodes.

In the piezo-resonator 161, excitation electrodes 138 and 139 are formed on both sides of the piezoelectric substrate 122 in the piezoelectric vibrating part 135. When an alternating voltage is applied across the excitation electrodes 138 and 139, therefore, the piezoelectric vibrating part 135 is excited in a shear mode.

In the piezo-resonator 161, further, lead electrodes 140 and 141 are formed on side surfaces of the piezoelectric substrate 122 in holding parts 136 and 137, respectively. Connecting conductive parts for electrically connecting the lead electrodes 140 and 141 with the excitation electrodes 138 and 139 are also formed along the side surfaces of the piezoelectric substrate 122.

Also in the piezo-resonator 161, the piezoelectric vibrating part 135 is excited in a shear mode when an alternating voltage is applied across the excitation electrodes 138 and 139. As understood from the piezo-resonator 161, the excitation electrodes 138 and 139 for exciting shear mode vibration may be provided not on upper or lower surfaces but on the side surfaces of a piezoelectric plate forming the piezoelectric vibrating part 135. Further, the excitation electrode 139 may be formed on the lower surface of the piezoelectric substrate 122 in the piezo-resonator 121 shown in FIG. 11, for example, while the excitation electrode 138 or 139 may be formed on one major surface of the piezoelectric substrate 122 in the piezo-resonator 161 shown in FIG. 13.

Figure 14:
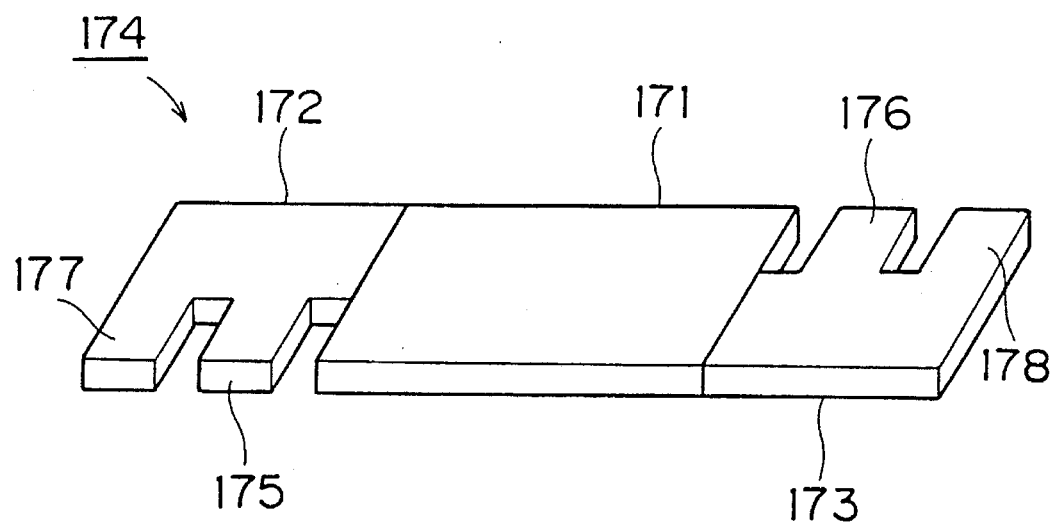
FIG. 14 is a perspective view for illustrating a modification of a substrate which is employed in at least one of the preferred embodiments of the present invention.

While the piezoelectric vibrating part, the first and second coupling parts, the dynamic damper(s) and the holding part(s) defining the piezo-resonator are formed by machining a single piezoelectric substrate in each of the aforementioned preferred embodiments, these parts may alternatively be formed by separate members. As shown in FIG. 14, for example, insulating plates 172 and 173 may be bonded to a rectangular piezoelectric plate 171 of the same thickness for forming a piezoelectric vibrating part, thereby defining a piezoelectric substrate 174. Such a substrate 174 may be employed for forming the piezo-resonator 11 according to the first preferred embodiment or another piezo-resonator, for example. While the insulating plates 172 and 173 are integrally provided with dynamic dampers 175 and 176 and holding parts 177 and 178 in the substrate 174 shown in FIG. 14, these parts may also be formed by separate members.

Figure 15:
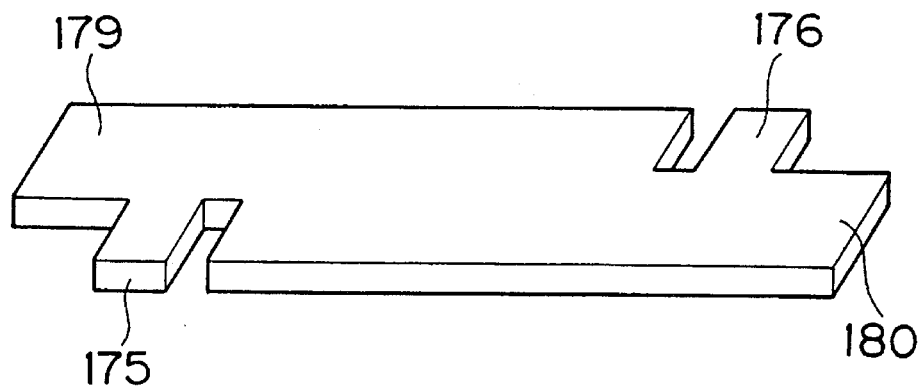
FIG. 15 is a perspective view showing another modification of a substrate which is employed in at least one of the preferred embodiments of the present invention.

While the holding part(s) is larger in width than the second coupling part(s) to have the original width of the rectangular piezoelectric substrate in the piezo-resonator according to each of the aforementioned preferred embodiments, substrate portions 179 and 180 of the same widths may be formed outside dynamic dampers 175 and 176, as shown in FIG. 15. In this case, the substrate portions 179 and 180 serve as second coupling parts and holding parts, whereby the holding parts are formed to have the same widths as the second coupling parts.

Figure 16:
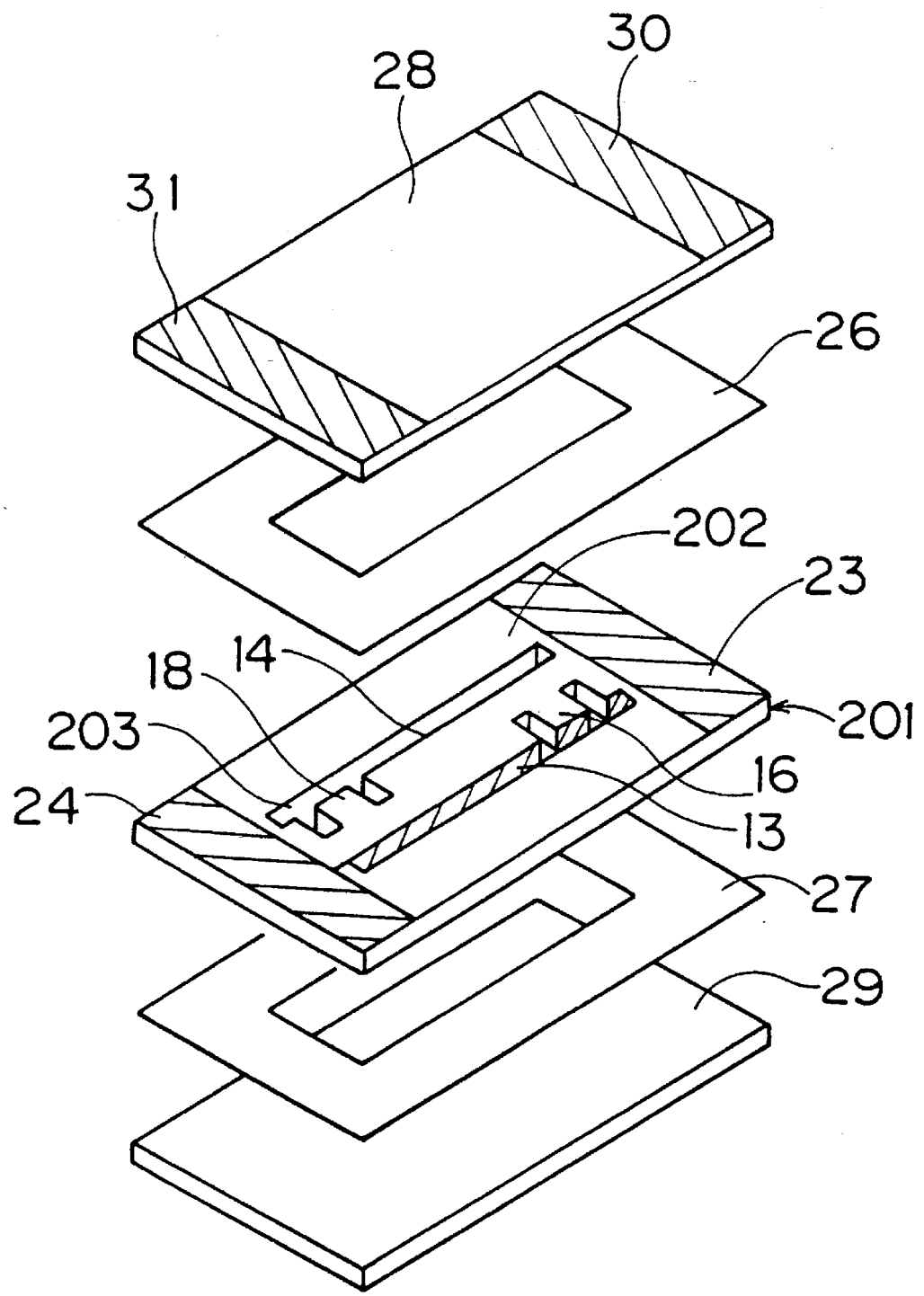
FIG. 16 is an exploded perspective view for illustrating a piezoelectric resonance component according to a modification of the preferred embodiment shown in FIG. 1.

While the resonance plate 25 is formed by bonding the spacer plates 21 and 22 to side portions of the piezo-resonator 11 in the piezoelectric resonance component according to the first preferred embodiment, the piezo-resonator 11 may alternatively be integrated with the spacer plates 21 and 22, to define the resonance plate 25. FIG. 16 is an exploded perspective view showing a piezoelectric resonance component employing a resonance plate 201 which is formed by a integral member.

In the piezoelectric resonance component shown in FIG. 16, the resonance plate 201 has a support part 202 which is in the form of a rectangular frame, so that a piezoelectric vibrating part and a dynamic damper are arranged in an opening 203 enclosed with the rectangular frame type support part 202. Namely, the resonance plate 201 is essentially structured in a similar manner to the resonance plate 25 shown in FIG. 1.

Therefore, corresponding portions are denoted by corresponding reference numerals, to omit redundant description.

It is possible to obtain the resonance plate 201 by preparing a piezoelectric plate having a rectangular planar shape and hollowing this piezoelectric plate by etching with a laser beam or the like.

The resonance plate 201, which is formed by a single piezoelectric plate, is excellent in environment resistance. In the resonance plate 25 shown in FIG. 1, infiltration of moisture etc. is easily caused if the piezo-resonator 11 and the spacer plates 21 and 22 are insufficiently bonded in portions A (FIG. 1). In the resonance plate 201, on the other hand, a vibrating part is reliably sealed since no such bonding portions A are present. Thus, it is possible to obtain a piezoelectric resonance component which is excellent in environment resistance.

While the dynamic dampers are formed on both sides of the vibrating part of the piezoelectric substrate in each of the aforementioned preferred embodiments, such a dynamic damper may be formed not on each side but only one side of the vibrating part. Also in this case, it is possible to further effectively trap vibrational energy as compared with a conventional piezo-resonator.

Further, a plurality of dynamic dampers may be formed between the vibrating part and the end surface of the piezoelectric substrate. In this case, the plurality of dynamic dampers may be formed only on one surface or both surfaces of the piezoelectric substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezo-resonator comprising:

a piezoelectric body including a pair of opposite surfaces and being polarized in a first direction, a first groove located in one of said pair of opposite surfaces of said piezoelectric body and a second groove located in the other of said pair of opposite surfaces of said piezoelectric body;

first and second resonance electrodes each located on a respective one of said pair of opposite surfaces of said piezoelectric body so as to be spaced apart by said piezoelectric body for applying a voltage in a direction substantially perpendicular to said first direction, said first and second resonance electrodes being located so as to define a resonance portion in which portions said first and second resonance electrodes overlap a common region of said piezoelectric body; wherein said resonance portion is located between said first and second grooves.

2. The piezo-resonator of claim 1, wherein said piezoelectric body is adapted to vibrate in a shear mode.

3. A piezo-resonator comprising:

a piezoelectric body including a pair of opposite surfaces and being polarized in a first direction, at least one first groove located in one of said pair of opposite surfaces of said piezoelectric body and at least one second groove located in said one of said pair of opposite surfaces of said piezoelectric body;

first and second resonance electrodes each located on a respective one of said pair of opposite surfaces of said piezoelectric body so as to be spaced apart by said piezoelectric body for applying a voltage in a direction substantially perpendicular to said first direction, said first and second resonance electrodes being located so as to define a resonance portion in which portions said first and second resonance electrodes overlap a common region of said piezoelectric body; wherein said first and second grooves define a vibration absorbing member.

4. The piezo-resonator of claim 3, wherein said vibration absorbing member comprises a dynamic damper.

5. The piezo-resonator of claim 3, wherein said vibration absorbing member and said piezoelectric body comprise a single unitary member.

6. The piezo-resonator in accordance with claim 3, wherein said vibration absorbing member has a shape and is arranged for receiving vibration from said piezoelectric body and for vibrating at a frequency that is substantially identical to a frequency of the vibration received from said piezoelectric body.

7. The piezo-resonator of claim 3, wherein said vibration absorbing member is a first vibration absorbing member, the piezo-resonator further comprising at least one third groove located in the other of said pair of opposite surfaces of said piezoelectric body and at least one fourth groove located in said other of said pair of opposite surfaces of said piezoelectric body, said third and fourth groove define a second vibration absorbing member.

* * * * *